(12) United States Patent
Cha et al.

(10) Patent No.: US 7,310,023 B2
(45) Date of Patent: Dec. 18, 2007

(54) FREQUENCY SYNTHESIZER

(75) Inventors: Choong-yul Cha, Yongin-si (KR);
Hoon-tae Kim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 70 days.

(21) Appl. No.: 11/386,696

(22) Filed: Mar. 23, 2006

(65) Prior Publication Data
US 2007/0008429 A1    Jan. 11, 2007

(30) Foreign Application Priority Data
Jul. 5, 2005    (KR)    .................... 10-2005-0060279

(51) Int. Cl.
*H03B 21/02* (2006.01)
*H04B 1/26* (2006.01)

(52) U.S. Cl. ........................................ 331/38; 455/314
(58) Field of Classification Search ................ 331/16, 331/37–39; 455/313–314
See application file for complete search history.

(56) References Cited

U.S. PATENT DOCUMENTS 7,092,645 B1 *    8/2006    Sternowski ................. 398/204
2004/0017841 A1    1/2004    Siwiak

* cited by examiner

*Primary Examiner*—David Mis
(74) *Attorney, Agent, or Firm*—Sughrue Mion Pllc.

(57) ABSTRACT

A frequency synthesizer in an ultra wide band (UWB) wireless communication system which transmits and receives data through multiband includes a frequency generation means which generates a plurality of frequency signals; and a frequency adjustment means which receives the plurality of frequency signals from the frequency generation means and generates center frequencies of all or part of sub-bands within the UWB through the frequency adjustment. Since all of the center frequencies of the sub-bands are generated, the utilization of the sub-bands can be enhanced for the wideband wireless communication. Furthermore, it is possible to enable the stable UWB communications by flexibly utilizing all of fourteen sub-bands since the sub-bands suffer less from the frequency interference in a complicated and variable wireless frequency environment.

31 Claims, 3 Drawing Sheets

FREQUENCY SYNTHESIZER

CROSS-REFERENCE TO RELATED APPLICATIONS

This application claims priority from Korean Patent Application No. 10-2005-0060279 filed on Jul. 5, 2005 in the Korean Intellectual Property Office, the entire disclosure of which is incorporated herein by reference.

BACKGROUND OF THE INVENTION

1. Field of the Invention

Apparatuses consistent with the present invention relate to frequency synthesis, and more particularly, a frequency synthesizer in an ultra wide band (UWB) wireless communication system which transmits and receives data through a multiband.

2. Description of the Prior Art

As access to high capacity multimedia data with high resolution has become commonplace recently, there are increasing demands for a high speed data transmission in a wireless communication system.

For the data transmission, the wireless communication system uses frequencies of a certain band. As the amount of data to be transmitted in the wireless communication system increases, the frequency bandwidth broadens.

Communication data are divided into circuit data and packet data. A frequency bandwidth for the transmission of the circuit data is generally narrow, whereas the transmission of the packet data requires a wider frequency bandwidth. Recently, a concept of a very high speed wireless communication has been suggested for the purpose of real-time transmission of high capacity multimedia data. Consequently, an even wider bandwidth is required. Such a wide frequency bandwidth for the very high speed wireless communication is referred to as an ultra wide band (UWB).

The UWB is a communication with a frequency bandwidth of 3.1 GHz~10.6 GHz assigned by the U.S. Federal Communications Commission (FCC). The UWB occupies a fractional bandwidth more than 20% and a frequency bandwidth of more than 500 MHz. Since UWB signals use a large frequency bandwidth, a power density value in a frequency domain can be lowered to a small value. Thus, even if the UWB signals superimpose with other communication signals at frequencies, little interference is produced. When they were first proposed and developed, UWB signals obtained a large frequency band based on very short signal pulses. Currently, various UWB techniques have been suggested such as code division multiple access (CDMA) and orthogonal frequency division multiplexing (OFDM).

Amongst these techniques, a UWB communication system based on a multi-band orthogonal frequency division multiplexing (MB-OFDM) divides a frequency bandwidth into a plurality of sub-bands. The MB-OFDM UWB communication system can transmit more data within the plurality of sub-bands by a unit time. One of the plurality of sub-bands is selected and data is transmitted through the selected sub-band, thereby improving security. In short, the data security can be improved by using the plurality of sub-bands in sequence.

FIG. 1 depicts a frequency bandwidth used in a MB-OFDM UWB communication system. As shown in FIG. 1, the frequency bandwidth is divided into five band groups, and consists of 14 sub-bands. The first band group is mandatory, and the other groups from the second band group to the fifth band group are optional.

In the band formation based on the MB-OFDM of FIG. 1, the first through the fourth band groups each consist of three sub-bands, and the fifth band group consists of two sub-bands.

Center frequencies of the sub-bands in the first band group are 3432 MHz, 3960 MHz and 4488 MHz, respectively. Center frequencies of the sub-bands in the second band group are 5016 MHz, 5544 MHz and 6072 MHz, respectively. Center frequencies of the sub-bands in the third band group are 6600 MHz, 7128 MHz and 7656 MHz. Center frequencies of the sub-bands in the fourth band group are 8184 MHz, 8712 MHz and 9240 MHz. Center frequencies of the sub-bands in the fifth band group are 9768 MHz and 10296 MHz.

It is to be noted that such a band plan base on the MB-OFDM may change in response to further technological development.

As discussed above, a formation of band groups is required to generate signals having center frequencies used in the UWB communication system.

FIG. 2 depicts a conventional frequency synthesizer for generating the center frequencies of the three sub-bands in the first band group.

In FIG. 2, the conventional frequency synthesizer is employed in a direct conversion MB-OFDM UWB system, and includes a local oscillator 10, a phase locked loop (PLL) 20, a ⅛ divider 30, a ½ divider 40, a first single side band (SSB) mixer 50, a selector 60, and a second SSB mixer 70. It should be noted that the term "1/N divider" represents a divider which divides a signal by N.

In the following, descriptions regarding the generation of center frequencies of the three sub-bands in the first band group are provided.

To generate the center frequencies 3432 MHz, 3960 MHz and 4488 MHz of the three sub-bands, the local oscillator 10 is set to a locked oscillation frequency and thus generates a frequency of 4224 MHz.

The PLL 20 stabilizes the frequency of the signal generated at the local oscillator 10.

The ⅛ divider 30 is provided with the frequency signal of 4224 MHz from the local oscillator 10 and generates a modulated frequency signal of 528 MHz by dividing the input signal by eight.

The ½ divider 40 is provided with the signal from the ⅛ divider 30 and generates a modulated frequency signal of 264 MHz by dividing the input signal by two.

The first SSB mixer 50 is provided with the modulated frequency signal of 528 MHz from the ⅛ divider 30 and the modulated frequency signal of 264 MHz from the ½ divider 40, and mixes the provided signals, and thereby generating a modulated frequency signal of 792 MHz.

The selector 60 is provided with the frequency signal of 264 MHz from the ½ divider 40 and the modulated frequency signal of 792 MHz from the first SSB mixer 50, and selects one of the provided signals.

The second SSB mixer 70 is provided with the frequency signal of 4224 MHz from the local oscillator 10 and the signal 264 MHz or 792 MHz selected by the selector 60, and generates desired center frequencies 3432 MHz, 3960 MHz and 4488 MHz of the three sub-bands by mixing the provided signals. In more detail, the second SSB mixer 70 generates the frequency signal of 4488 MHz by adding the frequency signals of 4224 MHz and 264 MHz, the frequency signal of 3960 MHz by subtracting 264 MHz from 4224 MHz, and the frequency signal of 3432 MHz by subtracting 792 MHz from 4224 MHz.

The conventional frequency synthesizer is implemented to generate only the center frequencies of the three sub-bands in the first band group which is currently utilized. This is due to the fact that the semiconductor technology cannot support the sub-bands at a high frequency band. In addition, the stabilized UWB communication without suffering interference in a complicated wireless service environment requires the flexible utilization of frequencies by extending the sub-bands. Ultimately, UWB communications using all of the fourteen sub-bands in the first through fifth band groups should be realized.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

An aspect of the present invention is to provide a frequency synthesizer for generating center frequency signals of a plurality of sub-bands for transmission and reception of signals in a ultra wide band (UWB) wireless communication system which transmits and receives data with multiband.

A frequency synthesizer includes a frequency generation means and a frequency adjustment means.

Specifically, a frequency synthesizer in an ultra wide band (UWB) wireless communication system which transmits and receives data through multiband includes a frequency generation means which generates a plurality of frequency signals; and a frequency adjustment means which receives the plurality of frequency signals from the frequency generation means and generates center frequencies of all or a part of sub-bands within the UWB through the frequency adjustment.

The frequency generation means includes a local oscillator which generates an oscillation frequency according to a frequency control signal; a division means which receives the frequency signal from the local oscillator and outputs a plurality of divided frequency signals; and a phase locked loop (PLL) which receives a reference frequency and the divided frequency signals from the division means, and outputs the frequency control signal which is to perform operations for stabilizing frequencies.

The local oscillator may generate a frequency signal of 12672 MHz to generate the center frequencies for all of the sub-bands according to the frequency control signal.

The division means may include first and second division parts which receive the frequency signal from the local oscillator and output a plurality of first divided frequency signals.

The first division part may include a first divider which receives the frequency signal from the local oscillator and outputs a frequency signal divided by three; a second divider which receives the frequency signal divided by three from the first divider and outputs a frequency signal divided by four; and a third divider which receives the frequency signal divided by four from the second divider and outputs a frequency signal divided by four.

The frequency signal output from the first divider may be a signal of 4224 MHz, the frequency signal output from the second divider may be a signal of 1056 MHz, and the frequency signal output from the third divider may be a signal of 264 MHz.

The second division part may include a first divider which receives the frequency signal from the local oscillator and outputs a frequency signal divided by two; and a second divider which receives the frequency signal divided by two from the first divider and outputs a frequency signal divided by two.

The frequency signal output from the first divider may be a signal of 6336 MHz, and the frequency signal output from the second divider may be a signal of 3168 MHz.

The frequency adjustment means may include a first mix part which receives the frequency signals from the frequency generation means and generates a plurality of frequency signals according to a control signal; a first select part which receives the frequency signals from the frequency generation means and outputs a selected frequency signal according to a selection signal; a second mixer which receives the frequency signals from the first mix part and the selected frequency signal from the first select part, and generates a plurality of frequency signals; and a second select part which receives the plurality of frequency signals generated from the second mix part and the frequency signals from the frequency generation means, and outputs a selected frequency signal.

The first mix part may generate the frequency signals of 1320 MHz, 792 MHz or 264 MHz.

The first select part may select one of the frequency signals of 6336 MHz and 3168 MHz output from the frequency generation means according to a selection signal.

The second mix part may include a first mixer which receives the frequency signals generated from the first mix part and the selected frequency signal from the first select part, and generates a plurality of frequency signals according to a control signal; and a second mixer which receives the plurality of frequency signals from the first mixer and the frequency signals from the frequency generation means, and generates another plurality of frequency signals.

The plurality of frequency signals generated by the first mixer may be center frequencies of first through third band groups of the UWB, and the plurality of frequency signals generated by the second mixer may be center frequencies of fourth and fifth band groups of the UWB.

The center frequencies of the first through third band groups may be 3432 MHz, 3960 MHz, 4488 MHz, 5016 MHz, 5544 MHz, 6072 MHz, 6600 MHz, 7128 MHz and 7656 MHz, and the center frequencies of the fourth and fifth band groups may be 8184 MHz, 8712 MHz, 9240 MHz, 9768 MHz and 10296 MHz.

BRIEF DESCRIPTION OF THE DRAWING FIGURES

These and/or other aspects and advantages of the invention will become apparent and more readily appreciated from the following description of exemplary embodiments, taken in conjunction with the accompanying drawing figures of which:

DETAILED DESCRIPTION OF THE EXEMPLARY EMBODIMENTS

Figure 1:
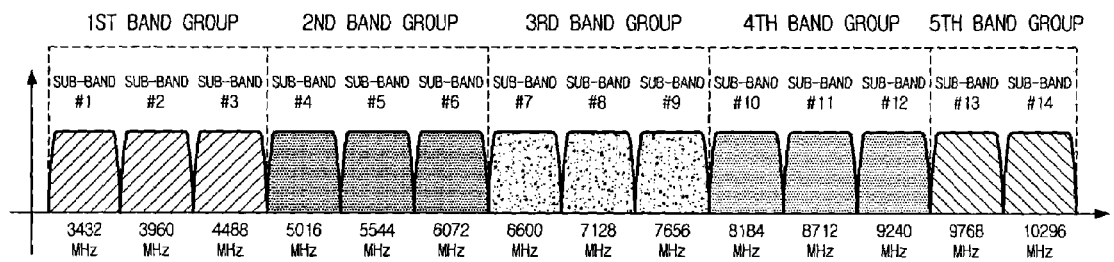
FIG. 1 illustrates a frequency band used in a multiband orthogonal frequency division multiplexing (MB-OFDM) ultra wide band (UWB) communication system.
Figure 2:
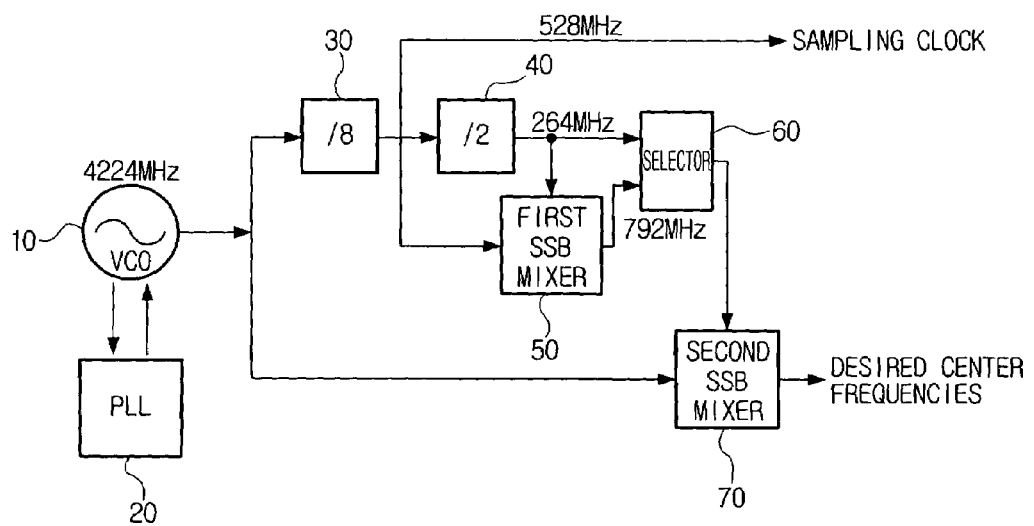
FIG. 2 illustrates a conventional frequency synthesizer for generating center frequencies of three sub-bands in a first band group.

Certain exemplary embodiments of the present invention will now be described in greater detail with reference to the accompanying drawings.

In the following description, same drawing reference numerals are used for the same elements even in different drawings. The matters defined herein are described at a high-level of abstraction to provide a comprehensive yet clear understanding of the invention. Also, well-known functions or constructions are not described in detail since they would obscure the invention in unnecessary detail.

Figure 3:
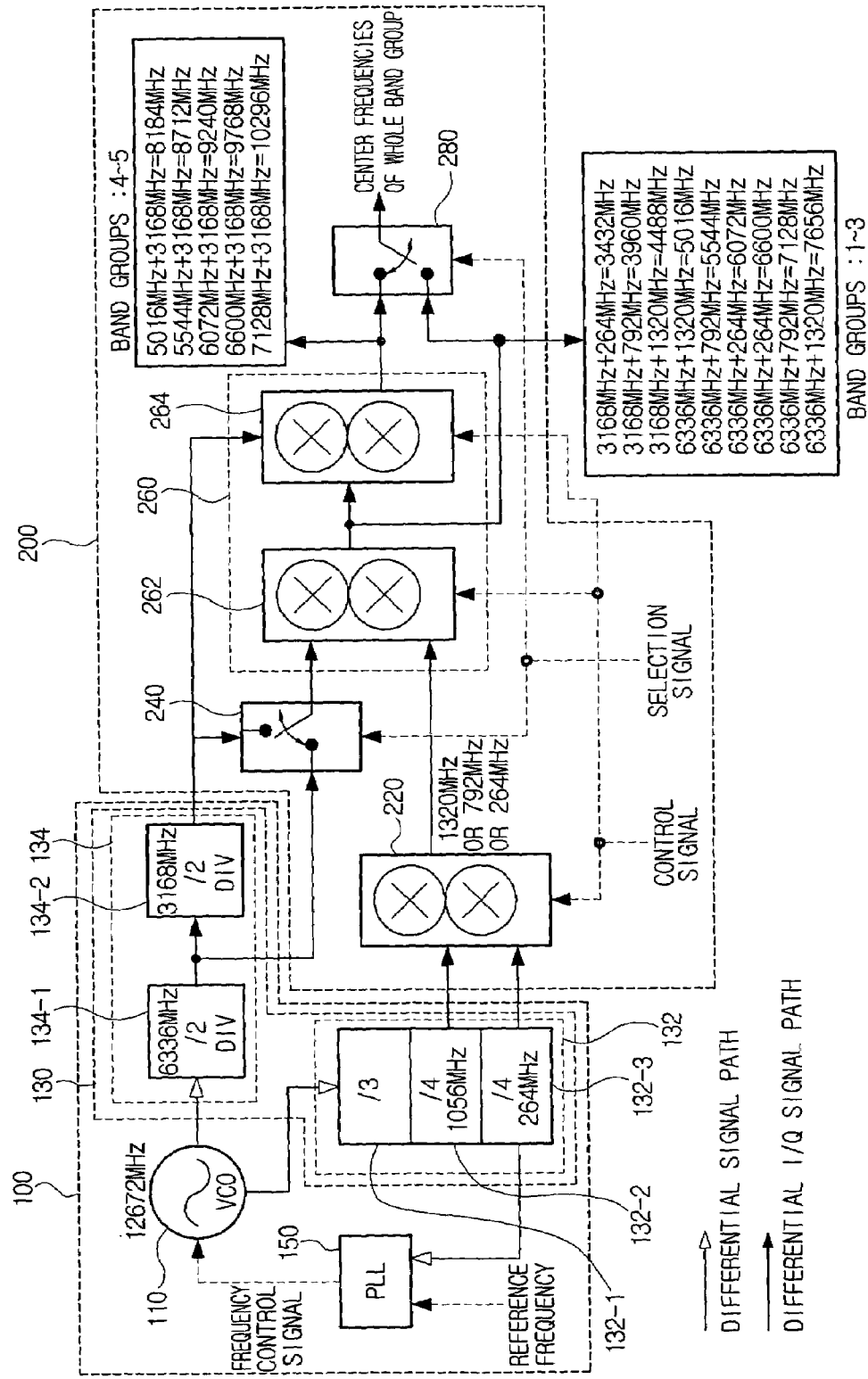
FIG. 3 illustrates a frequency synthesizer according to one exemplary embodiment of the present invention.

FIG. 3 depicts a frequency synthesizer according to one exemplary embodiment of the present invention.

Referring to FIG. 3, the frequency synthesizer includes a frequency generation means 100 and a frequency adjustment means 200. The frequency generation means 100 generates frequencies used to produce center frequencies within a fixed band. The frequency adjustment means 200 generates center frequencies of all or partial sub-bands within the fixed band by controlling the frequencies generated by the frequency generation means 100.

Herein, the fixed band is a ultra wide band (UWB), and the center frequencies of all sub-bands in the fixed band indicate center frequencies of all sub-bands within 3.1 GHz~10.6 GHz. That is, the center frequencies of all the sub-bands are center frequencies of the sub-bands of the first through fifth band groups as shown in FIG. 1. Specifically, the center frequencies are the fourteen sub-band center frequencies of 3432 MHz, 3960 MHz, 4488 MHz, 5016 MHz, 5544 MHz, 6072 MHz, 6600 MHz, 7128 MHz, 7656 MHz, 8184 MHz, 8712 MHz, 9240 MHz, 9768 MHz and 10296 MHz. It is to be noted that the sub-band center frequencies are not limited to these examples, and other frequencies may be used in response to technological changes.

The frequency generation means 100 includes a local oscillator 110, a division means 130 and a phase locked loop (PLL) 150.

The local oscillator 110 generates an oscillation frequency according to a frequency control signal. To generate the center frequencies of all the sub-bands according to the frequency control signal, the local oscillator 110 generates a frequency signal of 12672 MHz.

The division means 130 includes a first division part 132 and a second division part 134. The division means 130 is provided with the frequency signal from the local oscillator 110 and outputs a plurality of divided frequency signals. The first and second division parts 132 and 134 receive the frequency signal of 12672 MHz and output the plurality of divided frequency signals.

The first division part 132 includes a first divider 132-1, a second divider 132-2 and a third divider 132-3. The first divider 132-1 receives the frequency signal of 12672 MHz from the local oscillator 110 and outputs a frequency signal which is the input signal divided by three. The second divider 132-2 receives the frequency signal which has been divided by three from the first divider 132-1 and outputs a frequency signal further divided by four. The third divider 132-3 receives the frequency signal which has been divided by four from the second divider 132-2 and outputs a frequency signal further divided by four.

Accordingly, the first divider 132-1 receives the frequency signal of 12672 MHz from the local oscillator 110 and outputs a quadrature signal of 4224 MHz, which is a signal output by dividing the input signal of 12672 MHz by three. The second divider 132-2 receives the quadrature signal of 4224 MHz from the first divider 132-1 and outputs a quadrature signal of 1056 MHz which is output by dividing the received quadrature signal of 4224 MHz by four. The third divider 132-3 receives the quadrature signal of 1056 MHz from the second divider 132-2 and outputs a quadrature signal of 264 MHz which is output by dividing the received quadrature signal of 1056 MHz by four.

The second division part 134 includes a first divider 134-1 and a second divider 134-2. The first divider 134-1 receives the frequency signal of 12672 MHz from the local oscillator 110 and outputs a quadrature signal of 6336 MHz, which is a frequency signal output by dividing the received oscillator signal of 12672 MHz by two. The second divider 134-2 receives the quadrature signal of 6336 MHz from the first divider 134-1 and outputs a quadrature signal of 3168 MHz which is output by dividing the received quadrature signal of 6336 MHz by two.

The PLL 150 receives a reference frequency signal, and receives the divided frequency signal from the division means 130 and outputs the frequency control signal to perform operations for stabilizing the frequencies.

More specifically, the PLL 150 receives the reference frequency signal externally (not shown). Next, the PLL 150 is provided with the divided frequency signal of 264 MHz from the third divider 132-3 of the first division part 132 in the division means 130, and outputs the frequency control signal which is to perform operations stabilizing the frequencies.

The frequency adjustment means 200 includes a first mix part 220, a first select part 240, a second mix part 260 and a second select part 280.

The first mix part 220 is provided with the frequency signals from the frequency generation means 100 and generates a plurality of frequency signals according to a control signal. Specifically, the first mix part 220 receives the signals of 1056 MHz and 264 MHz from the second divider 132-2 and the third divider 132-3, respectively, of the first division part 132, and generates the frequency signals of 1320 MHz, 792 MHz or 264 MHz. That is, the first mix part 220 generates quadrature signals of 1320 MHz and 792 MHz by adding and subtracting the input signals of 1056 MHz and 264 MHz according to the control signal. In addition, the first mix part 220 outputs the signal of 264 MHz which is fed from the third divider 132-3.

The first select part 240 is provided with the frequency signals from the frequency generation means 100 and outputs a selected frequency signal according to a selection signal. Specifically, the first select part 240 receives the frequency signals of 6336 MHz and 3168 MHz from the first divider 134-1 and the second divider 134-2, respectively, of the first division part 134, selects one of the frequency signals of 6336 MHz and 3168 MHz according to the selection signal, and outputs the selected frequency signal.

The second mix part 260 includes a first mixer 262 and a second mixer 264. The second mix part 260 receives the frequency signal generated by the first mix part 220 and the frequency signal selected by the first select part 240, and generates a plurality of frequency signals.

The first mixer 262 of the second mix part 260 receives the frequency signal generated by the first mix part 220 according to a control signal, and the frequency signal selected by the first select part 240, and generates the plurality of frequency signals. In further detail, the first mixer 262 generates the frequency signals of 3432 MHz, 3960 MHz, 4488 MHz, 5016 MHz, 5544 MHz, 6072 MHz, 6600 MHz, 7128 MHz and 7656 MHz by properly adding the signals of 1320 MHz, 792 MHz and 264 MHz input from the first mix part 220 and the signals of 6336 MHz and 3168 MHz input from the first select part 240, according to the control signal. Hence, the plurality of frequency signals generated by the first mixer 262 corresponds to the center frequencies of the first through third band groups as shown in FIG. 1.

The second mixer 264 receives the plurality of frequency signals from the first mixer 262 and the frequency signal from the second divider 134-2 of the second division part 134, and outputs another plurality of frequency signals. In more detail, the second mixer 264 generates the frequency signals of 8184 MHz, 8712 MHz, 9240 MHz, 9768 MHz and 10296 MHz by properly adding the signals of 3432 MHz, 3960 MHz, 4488 MHz, 5016 MHz, 5544 MHz, 6072 MHz, 6600 MHz, 7128 MHz and 7656 MHz input from the first mixer 262, and the signal of 3168 MHz input from the second divider 134-2 of the second division part 134 according to the control signal. The plurality of frequency signals generated by the second mixer 264 corresponds to the center frequencies of the fourth and fifth band groups in FIG. 1.

The second select part 280 receives the plurality of frequency signals from the first mixer 262 and the second mixer 264 of the second mix part 260, and outputs a selected frequency signal according to a selection signal.

Specifically, the second select part 280 receives the signals of 3432 MHz, 3960 MHz, 4488 MHz, 5016 MHz, 5544 MHz, 6072 MHz, 6600 MHz, 7128 MHz and 7656 MHz, which are the center frequency signals of the first through third band groups from the first mixer 262, and the signals of 8184 MHz, 8712 MHz, 9240 MHz, 9768 MHz and 10296 MHz, which are the center frequency signals of the fourth and fifth band groups from the second mixer 264, and outputs a selected frequency signal according to the selection signal. Thus, the second select part 280 can produce the center frequencies of all the sub-bands within the UWB from 3.1 GHz to 10.6 GHz of the first through fifth band groups.

Figure 4:
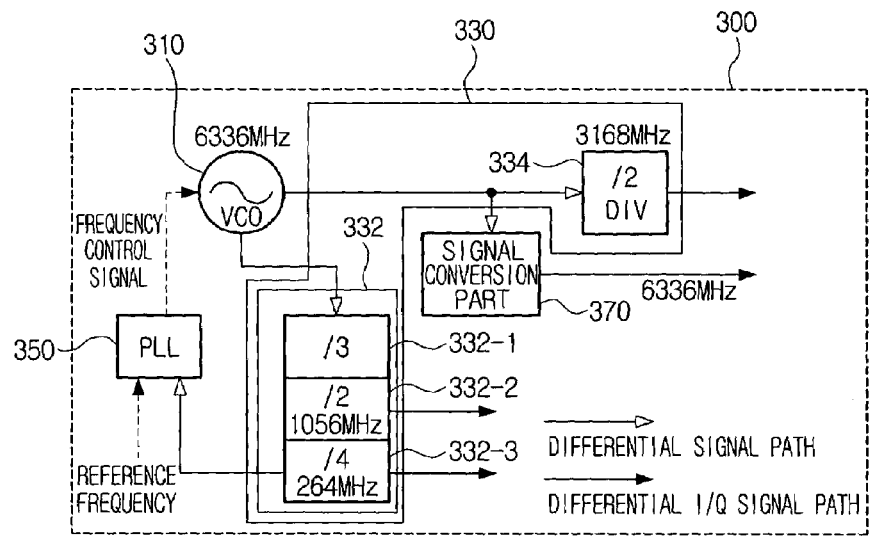
FIG. 4 illustrates a frequency generation means in the frequency synthesizer according to another exemplary embodiment of the present invention.

FIG. 4 depicts a frequency generation means 300 of the frequency synthesizer according to another exemplary embodiment of the present invention.

The frequency generation means 300 in FIG. 4 provides a signal conversion part 334, in place of the first divider 134-1 of the second division part 134 in the frequency generation means 100 in FIG. 3.

As shown in FIG. 4, the frequency generation means 300 includes a local oscillator 310, a division means 330, a PLL 350 and a signal conversion part 370.

The local oscillator 310 produces an oscillation frequency according to a frequency control signal. The local oscillator 310 produces a frequency signal of 6336 MHz to generate the center frequencies of the whole sub-band according to the frequency control signal.

The first divider 134-1 which is the ½ divider for dividing the signal input from the local oscillator 110 by 2 in FIG. 3, is replaced by the signal conversion part 334 which shifts the phase of the input signal by 90 degrees as shown in FIG. 4. Hence, in order for the frequency generation means of FIG. 3 and FIG. 4 to generate the plurality of the same frequency signals, the oscillation frequency of the local oscillator 310 of FIG. 4 is set to 6336 MHz which is the half of the oscillation frequency of 12672 MHz of the local oscillator 110 of FIG. 3.

The division means 330 includes a first division part 332 and a second division part 334. The division means 330 receives the frequency signal from the local oscillator 310 and outputs a plurality of divided frequency signals. The first and second division parts 332 and 334 both receive the frequency signal of 6336 MHz from the local oscillator 310 and output a plurality of divided frequency signals.

The first division part 332 includes a first divider 332-1, a second divider 332-2 and a third divider 332-3. The first divider 332-1 receives the frequency signal of 6336 MHz from the local oscillator 310 and outputs a frequency signal of 2112 MHz which is output by dividing the input frequency signal of 6336 MHz by three. The second divider 332-2 receives the frequency signal of 2112 MHz from the first divider 332-1 and outputs a frequency signal of 1056 MHz which is output by dividing the received frequency signal of 2112 MHz by two. The third divider 332-3 receives the frequency signal of 1056 MHz from the second divider 332-2 and outputs a frequency signal of 256 MHz which is output by dividing the received frequency signal of 1056 MHz by four.

The signal of 1056 MHz output from the second divider 332-2 and the signal of 264 MHz output from the third divider 332-3 are each utilized as an input signal of the frequency adjustment means which generates the center frequencies, in a manner similar to the frequency generation means 100 in FIG. 3.

The second division part 334 receives the frequency signal of 6336 MHz from the local oscillator 310 and outputs a frequency signal divided by two. As a result, the frequency signal produced by the second division part 334 is 3168 MHz which is the half of the frequency signal 6336 MHz output from the local oscillator 310. The frequency signal produced by the second division part 334 is used as the input signal of the frequency adjustment means, in a manner similar to the frequency generation means 100 of FIG. 3.

The PLL 350 receives a reference frequency signal and the divided frequency signal from the division means 330, and outputs the frequency control signal for performing operations stabilizing the frequencies. More specifically, the PLL 350 receives the reference frequency signal and the frequency signal of 264 MHz from the third divider 332-3 of the first division part 332 in the division means 330, and outputs the frequency control signal for performing operations to stabilize the frequencies.

The signal conversion part 370 receives the frequency signal of 6336 MHz from the local oscillator 310, shifts the phase of the input signal by 90 degrees, converts the shifted signal to an in-phase (I) signal and a quadrature (Q) signal, phases of which are different by 90 degrees. Currently, the signal conversion part 370 can be implemented using a poly phase filter (PPF).

The signal conversion part 370 receives a differential signal of 6336 MHz from the local oscillator 310 and outputs a differential I/Q signal. The output signal of the signal conversion part 370 is used as the input signal of the frequency adjustment means.

When the differential I/Q signal is generated from 6336 MHz of the local oscillator 310, the signal conversion part 370 can be omitted. In this case, the differential I/Q signal of 6336 MHz which is generated by the local oscillator 310 is used directly as the input signal of the frequency adjustment means.

In FIG. 4, the second divider 332-2, which is the ½ divider of the first division part 332, and the second division part 334 can be omitted by setting the oscillation frequency 6336 MHz of the local oscillator 310 to 3168 MHz which is the half frequency of 6336 MHz.

In case that the oscillation frequency of the local oscillator 310 is set to 3168 MHz, the first divider 332-1 divides the oscillation frequency by 3 and thus outputs 1056 MHz, and the third divider 332-3 divides the input signal 1056 MHz of the first divider 332-1 by 4 and thus outputs the signal of 264 MHz.

Accordingly, the output signals of 1056 MHz and 264 MHz of the first division part 332 are the same as in the case when the oscillation frequency of 6336 MHz of the local oscillator 310 is used in FIG. 4. Also, the output signal 3168 MHz of the signal conversion part 334 is equal to the signal which is fed from the second division part 334 to the second mixer 264 of the frequency adjustment means.

Figure 5:
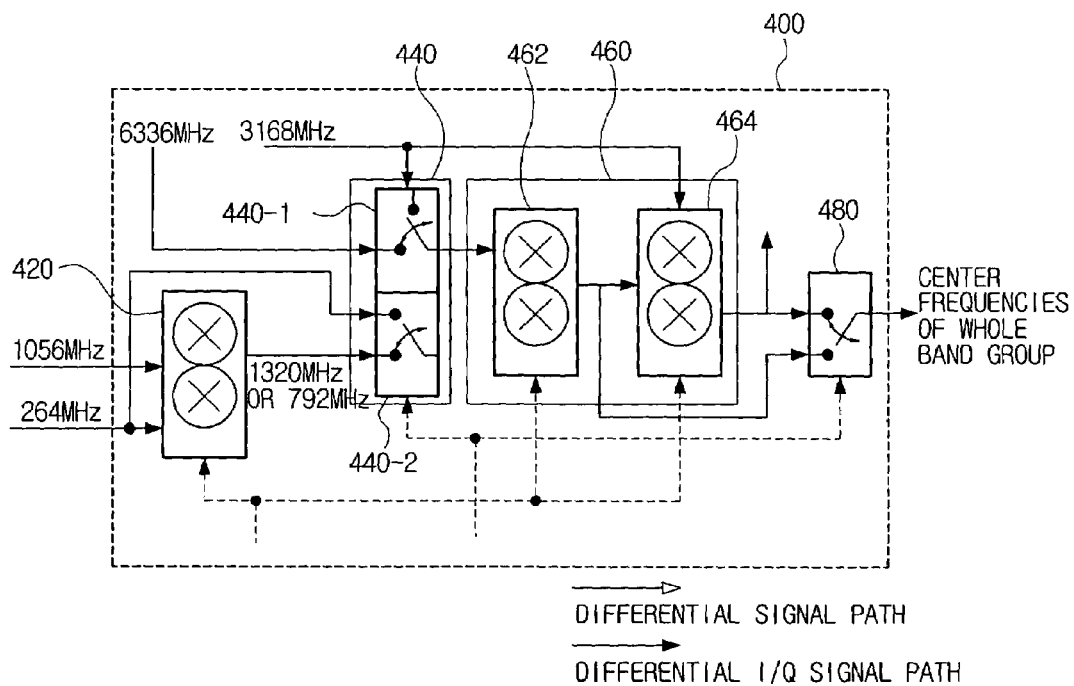
FIG. 5 illustrates a frequency adjustment means in the frequency synthesizer according to another exemplary embodiment of the present invention.

FIG. 5 depicts a frequency adjustment means of the frequency synthesizer according to another exemplary embodiment of the present invention. In the frequency adjustment means 400 of FIG. 5, a first select part 440 includes two switches, that is, a first switch 440-1 and a second switch 440-2, in contrast to the frequency adjustment means 200 in FIG. 3 where the first select part 240 is implemented using a single switch.

In the exemplary embodiment of the frequency adjustment means 400 depicted in FIG. 5, the input signal may be the output signal of the frequency generation means 100 in FIG. 3 or the frequency generation means 300 of FIG. 4.

Referring to FIG. 5, the frequency adjustment means 400 includes a first mix part 420, a first select part 440, a second mix part 460 and a second select part 480.

When frequency signals are input from the frequency generation means, the first mix part 420 generates a plurality of frequency signals according to a control signal. The first mix part 420 receives the signals of 1056 MHz and 264 MHz from the frequency generation means, and outputs signals of 1320 MHz or 792 MHz by adding and subtracting the signals 1056 MHz and 264 MHz according to the control signal.

The first select part 440 includes the first switch 440-1 and the second switch 440-2. The first select part 440 receives the frequency signals from the frequency generation means and the first mix part 420, and outputs a selected frequency signal according to a selection signal.

The first switch 440-1 selects one of the frequency signals of 6336 MHz and 3168 MHz which are input from the frequency generation means, according to the selection signal. When the frequency signal of 264 MHz from the frequency generation means and the frequency signal of 1320 MHz or 792 MHz from the first mix part 420 are input to the second switch 440-2, the second switch 440-2 selects one of the input signals according to the selection signal.

Hence, the first select part 440 can output one of the signals of 6336 MHz, 3168 MHz, 1320 MHz, 792 MHz and 264 MHz.

The second mix part 460 includes a first mixer 462 and a second mixer 464. The second mix part 460 is provided with the selected frequency signal from the first select part 440 and outputs a plurality of frequency signals according to a control signal.

The first mixer 462, according to the control signal, is provided with the selected frequency signal from the first select part 440 and generates the plurality of frequency signals. The signals produced by the first mixer 462 correspond to the center frequencies of the sub-bands in the first through third band groups in FIG. 1. Since the first select part 440 outputs one of the signals of 6336 MHz, 3168 MHz, 1320 MHz, 792 MHz and 264 MHz, the first mixer 462 can produce 3432 MHz, 3960 MHz, 4488 MHz, 5016 MHz, 5544 MHz, 6072 MHz, 6600 MHz, 7128 MHz and 7656 MHz, which are the center frequencies of the first through third band groups, by properly adding the signals output from the first select part 440 according to the control signal.

When the plurality of frequency signals produced from the first mixer 462 and the signal of 3168 MHz from the frequency generation means are input to the second mixer 464, the second mixer 464 generates another plurality of frequency signals. The frequency signals produced by the second mixer 464 correspond to the center frequencies of the sub-bands in the fourth and fifth band groups.

The second mixer 464 can produce the center frequency signals of 8184 MHz, 8712 MHz, 9240 MHz, 9768 MHz and 10296 MHz of the forth and fifth band groups by properly adding the signals of 3432 MHz, 3960 MHz, 4488 MHz, 5016 MHz, 5544 MHz, 6072 MHz, 6600 MHz, 7128 MHz and 7656 MHz output from the first mixer 462, and the signal of 3168 MHz output from the frequency generation means according to the control signal.

The second select part 480 is provided with the plurality of frequency signals from the first mixer 462 and the second mixer 464 of the second mix part 460, and outputs a selected frequency signal.

In more detail, when the center frequency signals of the sub-bands of the first through third band groups produced by the first mixer 462 and the center frequency signals of the sub-bands of the fourth and fifth band groups produced by the second mixer 464 are input to the second select part 480, the second select part 480 outputs the center frequencies of the whole sub-band within the fixed band from 3.1 GHz to 10.6 GHz of the first through fifth band groups according to the selection signal.

That is, the second select part 480 can produce the center frequencies of the whole sub-band in the UWB by outputting one of 3432 MHz, 3960 MHz, 4488 MHz, 5016 MHz, 5544 MHz, 6072 MHz, 6600 MHz, 7128 MHz and 7656 MHz fed from the first mixer 462, and 8184 MHz, 8712 MHz, 9240 MHz, 9768 MHz and 10296 MHz fed from the second mixer 464.

Although the frequency synthesizer as shown in FIGS. 3, 4 and 5 can produce the center frequencies of all the fourteen sub-bands within the fixed band (3.1 GHz~106 GHz), the frequency synthesizer may select and utilize only a part of the center frequencies of the sub-bands. For example, the frequency synthesizer can select and use only the center frequency of 3432 MHz, 3960 MHz and 4488 MHz of the sub-bands in the first band group.

As set forth above, in the UWB wireless communication system which transmits and receives data through multi-band, all of the center frequencies of the sub-bands within the assigned band (3.1 GHz~10.6 GHz) are generated. Thus, the utilization of the sub-bands can be enhanced for the wideband wireless communication.

Furthermore, it is possible to enable the stable UWB communications by flexibly utilizing all of fourteen sub-bands in the first through fifth band groups since the sub-bands suffer less from the frequency interference in a complicated and variable wireless frequency environment.

While the present invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A frequency synthesizer in an Ultra Wide Band (UWB) wireless communication system which transmits and receives data through multiband, comprising:
    a frequency generator which generates a plurality of frequency signals; and
    a frequency adjustor which receives the plurality of frequency signals from the frequency generator and generates center frequencies of all or part of sub-bands within the UWB through a frequency adjustment.

2. The frequency synthesizer of claim 1, wherein the frequency generator comprises:
    a local oscillator which generates an oscillation frequency according to a frequency control signal;
    a division unit which receives the frequency signal from the local oscillator and outputs a plurality of divided frequency signals; and
    a Phase Locked Loop (PLL) which receives a reference frequency and the divided frequency signals from the division means, and outputs the frequency control signal which stabilizes frequencies.

3. The frequency synthesizer of claim 2, wherein the local oscillator generates a frequency signal of 12672 MHz to generate the center frequencies of all of the sub-bands according to the frequency control signal.

4. The frequency synthesizer of claim 2, wherein the division unit comprises:
    a first division part which receives the frequency signal from the local oscillator and outputs a plurality of first divided frequency signals; and
    a second division part which receives the frequency signal from the local oscillator and outputs a plurality of second divided frequency signals.

5. The frequency synthesizer of claim 4, wherein the first division part comprises:
    a first divider which receives the frequency signal from the local oscillator and outputs a frequency signal divided by three;
    a second divider which receives the frequency signal divided by three from the first divider and outputs a frequency signal divided by four; and
    a third divider which receives the frequency signal divided by four from the second divider and outputs a frequency signal divided by four.

6. The frequency synthesizer of claim 5, wherein the frequency signal output from the first divider is a signal of 4224 MHz, the frequency signal output from the second divider is a signal of 1056 MHz, and the frequency signal output from the third divider is a signal of 264 MHz.

7. The frequency synthesizer of claim 4, wherein the second division part comprises:
    a first divider which receives the frequency signal from the local oscillator and outputs a frequency signal divided by two; and
    a second divider which receives the frequency signal divided by two from the first divider and outputs a frequency signal divided by two.

8. The frequency synthesizer of claim 7, wherein the frequency signal output from the first divider is a signal of 6336 MHz, and the frequency signal output from the second divider is a signal of 3168 MHz.

9. The frequency synthesizer of claim 1, wherein the frequency adjustor comprises:
    a first mix part which receives the frequency signals from the frequency generator and generates a plurality of first mix part frequency signals according to a control signal;
    a first select part which receives the frequency signals from the frequency generator and outputs a selected frequency signal according to a selection signal;
    a second mix part which receives the frequency signals from the first mix part and the selected frequency signal from the first select part, and generates a plurality of second mix part frequency signals; and
    a second select part which receives the plurality of frequency signals generated from the second mix part and the frequency signals from the frequency generator, and outputs a selected frequency signal.

10. The frequency synthesizer of claim 9, wherein the first mix part generates the frequency signals of 1320 MHz, 792 MHz and 264 MHz.

11. The frequency synthesizer of claim 9, wherein the first select part selects one of the frequency signals of 6336 MHz and 3168 MHz output from the frequency generator according to a selection signal.

12. The frequency synthesizer of claim 9, wherein the second mix part comprises:
    a first mixer which receives the frequency signals generated from the first mix part and the selected frequency signal from the first select part, and generates a plurality of first mixed frequency signals according to a control signal; and
    a second mixer which receives the plurality of first mixed frequency signals from the first mixer and the frequency signals from the frequency generator, and generates a plurality of second mixed frequency signals.

13. The frequency synthesizer of claim 12, wherein the plurality of frequency signals generated by the first mixer are center frequencies of first through third band groups of the UWB, and
    the plurality of frequency signals generated by the second mixer are center frequencies of fourth and fifth band groups of the UWB.

14. The frequency synthesizer of claim 13, wherein the center frequencies of the first through third band groups are 3432 MHz, 3960 MHz, 4488 MHz, 5016 MHz, 5544 MHz, 6072 MHz, 6600 MHz, 7128 MHz and 7656 MHz, and
    the center frequencies of the fourth and fifth band groups are 8184 MHz, 8712 MHz, 9240 MHz, 9768 MHz and 10296 MHz.

15. The frequency synthesizer of claim 1, wherein the frequency generator comprises:
    a local oscillator which generates an oscillation frequency according to a frequency control signal;
    a division unit which receives a frequency signal from the local oscillator and outputs a plurality of divided frequency signals;
    a PLL which receives a reference frequency signal and the divided frequency signals from the division unit, and outputs the frequency control signal which stabilizes frequencies; and
    a signal conversion part which receives the frequency signal from the local oscillator, converts the signal to an in-phase (I) signal and a quadrature (Q) signal, by shifting a phase of the signal by 90 degrees, which thereby results in a phase difference of I and Q signals of 90 degrees, and outputs the converted signal.

16. The frequency synthesizer of claim 15, wherein the local oscillator generates the frequency signal of 6336 MHz to generate the center frequencies of all of the sub-bands according to the frequency control signal.

17. The frequency synthesizer of claim 15, wherein the division unit comprises:

a first division part which receives a frequency signal from the local oscillator and outputs a plurality of first divided frequency signals; and a second division part which receives a frequency signal from the local oscillator and outputs a plurality of second divided frequency signals.

18. The frequency synthesizer of claim 17, wherein the first division part comprises:

a first divider which receives the frequency signal from the local oscillator and outputs a frequency signal divided by three;

a second divider which receives the frequency signal divided by three from the first divider and outputs a frequency signal divided by two; and a third divider which receives the frequency signal divided by two from the second divider and outputs a frequency signal divided by four.

19. The frequency synthesizer of claim 18, wherein the frequency signal output from the first divider is a signal of 2112 MHz, the frequency signal output from the second divider is a signal of 1056 MHz, and the frequency signal output from the third divider is a signal of 264 MHz.

20. The frequency synthesizer of claim 17, wherein the second division part receives the frequency signal from the local oscillator and outputs a frequency signal divided by two.

21. The frequency synthesizer of claim 20, wherein the frequency signal output from the second division part is a signal of 3168 MHz.

22. The frequency synthesizer of claim 1, wherein the frequency adjustment means comprises:

a first mix part which receives the frequency signals from the frequency generator and generates a plurality of first mixed frequency signals according to a control signal;

a first select part which receives the frequency signals from the frequency generator and the frequency signals from the first mix part, and outputs a selected frequency signal according to a selection signal;

a second mixer which receives the selected frequency signal from the first select part and generates a plurality of second mixed frequency signals; and a second select part which receives the plurality of second mixed frequency signals generated from the second mix part and outputs a selected frequency signal.

23. The frequency synthesizer of claim 22, wherein the first mix part generates frequency signals of 1320 MHz and 792 MHz.

24. The frequency synthesizer of claim 22, wherein the first select part comprises:

a first switch which selects one of the frequency signals of 6336 MHz and 3168 MHz output from the frequency generator according to a selection signal; and a second switch which receives the frequency signal of 264 MHz from the frequency generator and the frequency signal of 1320 MHz or 792 MHz from the first mix part, and selects one of the received frequency signals according to a selection signal.

25. The frequency synthesizer of claim 22, wherein the second mix part comprises:

a first mixer which receives the selected frequency signal from the first select part and generates a plurality of first mixer frequency signals according to a control signal; and a second mixer which receives the plurality of first mixer frequency signals from the first mixer and the frequency signals from the frequency generator, and generates a plurality of second mixer frequency signals.

26. The frequency synthesizer of claim 25, wherein the plurality of first mixer frequency signals generated by the first mixer are center frequencies of sub-bands of first through third band groups of the UWB, and the plurality of second mixer frequency signals generated by the second mixer are center frequencies of sub-bands of fourth and fifth band groups of the UWB.

27. The frequency synthesizer of claim 26, wherein the center frequencies of the first through third band groups are 3432 MHz, 3960 MHz, 4488 MHz, 5016 MHz, 5544 MHz, 6072 MHz, 6600 MHz, 7128 MHz and 7656 MHz, and the center frequencies of the fourth and fifth band groups are 8184 MHz, 8712 MHz, 9240 MHz, 9768 MHz and 10296 MHz.

28. The frequency synthesizer of claim 1, wherein the UWB ranges from 3.1 GHz to 10.6 GHz.

29. The frequency synthesizer of claim 28, wherein the UWB is divided into five band groups from the first band group to the fifth band group.

30. The frequency synthesizer of claim 29, wherein a number of the sub-bands of the first through fifth band groups are fourteen.

31. The frequency synthesizer of claim 30, wherein the center frequencies of the sub-bands of the first through fifth band groups are 3432 MHz, 3960 MHz, 4488 MHz, 5016 MHz, 5544 MHz, 6072 MHz, 6600 MHz, 7128 MHz, 7656 MHz, 8184 MHz, 8712 MHz, 9240 MHz, 9768 MHz and 10296 MHz.

* * * * *